United States Patent
Chuang et al.

(10) Patent No.: US 11,893,334 B2
(45) Date of Patent: Feb. 6, 2024

(54) METHOD FOR OPTIMIZING FLOOR PLAN FOR AN INTEGRATED CIRCUIT

(71) Applicants: TAIWAN SEMICONDUCTOR MANUFACTURING CO., LTD., Hsinchu (TW); TSMC NANJING COMPANY LIMITED, Nanjing (CN)

(72) Inventors: Yi-Lin Chuang, Taipei (TW); Shi-Wen Tan, Nanjing (CN); Song Liu, Nanjing (CN); Shih-Yao Lin, Hsinchu (TW); Wen-Yuan Fang, Nanjing (CN)

(73) Assignees: TAIWAN SEMICONDUCTOR MANUFACTURING CO., LTD., Hsinchu (TW); TSMC NANJING COMPANY LIMITED, Nanjing (CN)

( * ) Notice: Subject to any disclaimer, the term of this patent is extended or adjusted under 35 U.S.C. 154(b) by 0 days.

(21) Appl. No.: 17/875,139

(22) Filed: Jul. 27, 2022

(65) Prior Publication Data
US 2022/0366118 A1 Nov. 17, 2022

Related U.S. Application Data

(63) Continuation of application No. 17/071,862, filed on Oct. 15, 2020, now Pat. No. 11,443,096.

(30) Foreign Application Priority Data

Sep. 21, 2020 (CN) .......................... 202010996475.6

(51) Int. Cl.
*G06F 30/00* (2020.01)
*G06F 30/392* (2020.01)
(Continued)

(52) U.S. Cl.
CPC .......... *G06F 30/392* (2020.01); *G06F 30/373* (2020.01); *G06F 30/394* (2020.01); *G06F 30/398* (2020.01)

(58) Field of Classification Search
CPC .... G06F 30/392; G06F 30/398; G06F 30/373; G06F 30/394
See application file for complete search history.

(56) References Cited

U.S. PATENT DOCUMENTS 6,057,169 A * 5/2000 Singh ...................... G06F 30/39
257/E23.079
6,075,934 A    6/2000 Chiluvuri
(Continued)

FOREIGN PATENT DOCUMENTS

CN    108228972 B    6/2018
CN    115329713 B *  2/2023
(Continued)

*Primary Examiner* — Naum Levin
(74) *Attorney, Agent, or Firm* — Maschoff Brennan

(57) ABSTRACT

A method is provided and includes several operations: forming a first group of macros in a first region, wherein the first group of macros are aligned with a first boundary of a channel that is coupled thereto through pins of the first group of macros; forming a second group of macros in the first region to align with a second boundary of the channel that is coupled thereto through pins of the second group of macros, wherein the first and second groups of macros are coupled to a first register; and forming a third group of macros in a second region different from the first region. A first macro and a second macro that are in the third group of macros are aligned with the first and second boundaries respectively. The third group of macros are coupled to a second register different from the first register.

20 Claims, 13 Drawing Sheets

(51) Int. Cl.
  *G06F 30/373* (2020.01)
  *G06F 30/398* (2020.01)
  *G06F 30/394* (2020.01)

(56) References Cited

U.S. PATENT DOCUMENTS

| | | | |
|---|---|---|---|
| 6,222,213 B1 * | 4/2001 | Fujiwara | H01L 27/11898 257/E27.11 |
| 6,789,243 B2 | 9/2004 | Nakagawa | |
| 6,829,730 B2 * | 12/2004 | Nadeau-Dostie | G01R 31/318555 714/724 |
| 7,165,232 B2 * | 1/2007 | Chen | H01L 27/0207 257/E27.11 |
| 7,263,679 B2 * | 8/2007 | Kuge | G06F 30/39 716/136 |
| 7,752,588 B2 | 7/2010 | Bose | |
| 7,872,283 B2 * | 1/2011 | Matsuoka | H01L 23/5286 257/691 |
| 7,937,682 B2 | 5/2011 | Arunachalam | |
| 8,028,265 B2 | 9/2011 | Ramsour | |
| 8,028,266 B2 | 9/2011 | Ramsour | |
| 8,037,442 B2 * | 10/2011 | Zou | G06F 30/392 716/135 |
| 8,099,702 B2 | 1/2012 | Hou | |
| 8,286,117 B2 | 10/2012 | Arayama | |
| 8,549,447 B2 * | 10/2013 | Eisenstadt | H01L 23/5225 716/120 |
| 8,549,457 B1 * | 10/2013 | Moore | G06F 30/392 716/119 |
| 8,629,548 B1 | 1/2014 | Andreev et al. | |
| 9,047,433 B2 * | 6/2015 | Yang | G06F 30/392 |
| 9,324,256 B2 * | 4/2016 | Liao | G09G 3/2085 |
| 9,929,095 B2 * | 3/2018 | Singewar | H01L 23/5286 |
| 10,811,375 B2 * | 10/2020 | Chanumolu | H01L 24/06 |
| 10,977,410 B2 | 4/2021 | Patel et al. | |
| 11,443,096 B2 | 9/2022 | Chuang et al. | |
| 2002/0004929 A1 * | 1/2002 | Osaki | G06F 30/39 257/E27.11 |
| 2003/0226129 A1 | 12/2003 | Nakagawa et al. | |
| 2005/0044522 A1 * | 2/2005 | Maeda | H01L 27/11803 430/5 |
| 2007/0245280 A1 | 10/2007 | Van Eijk | |
| 2007/0245281 A1 | 10/2007 | Hong | |
| 2010/0023910 A1 | 1/2010 | Chen | |
| 2011/0239177 A1 | 9/2011 | Chong | |
| 2016/0232274 A1 | 8/2016 | Dixon | |
| 2017/0316145 A1 | 11/2017 | Tang | |
| 2023/0068280 A1 * | 3/2023 | Lin | G06F 30/394 |

FOREIGN PATENT DOCUMENTS

| | | |
|---|---|---|
| EP | 0067304 A2 * | 12/1982 |
| EP | 0725349 A2 * | 8/1996 |
| JP | H0561940 A | 3/1993 |
| JP | 2543155 B2 | 10/1996 |
| JP | H09153084 A | 6/1997 |
| JP | 2000031287 A | 1/2000 |
| JP | 2001298089 A | 10/2001 |
| JP | 2003242190 A | 8/2003 |
| JP | 2006-039782 A | 2/2006 |
| JP | 4156274 B2 | 9/2008 |
| JP | 5373304 B2 | 12/2013 |
| TW | 202032396 A | 9/2020 |
| TW | I707337 B * | 10/2020 |
| WO | 0065487 A1 | 11/2000 |

* cited by examiner

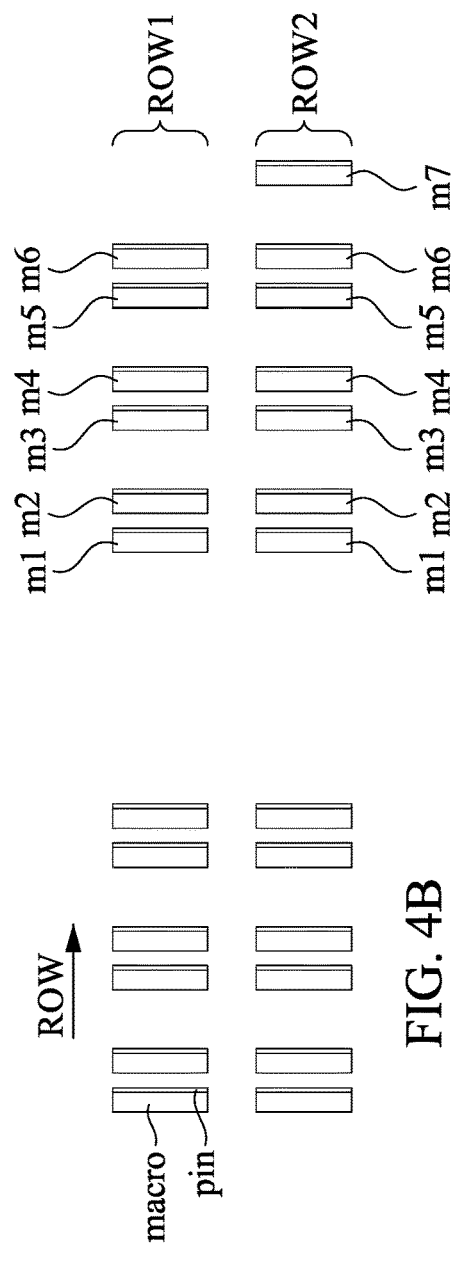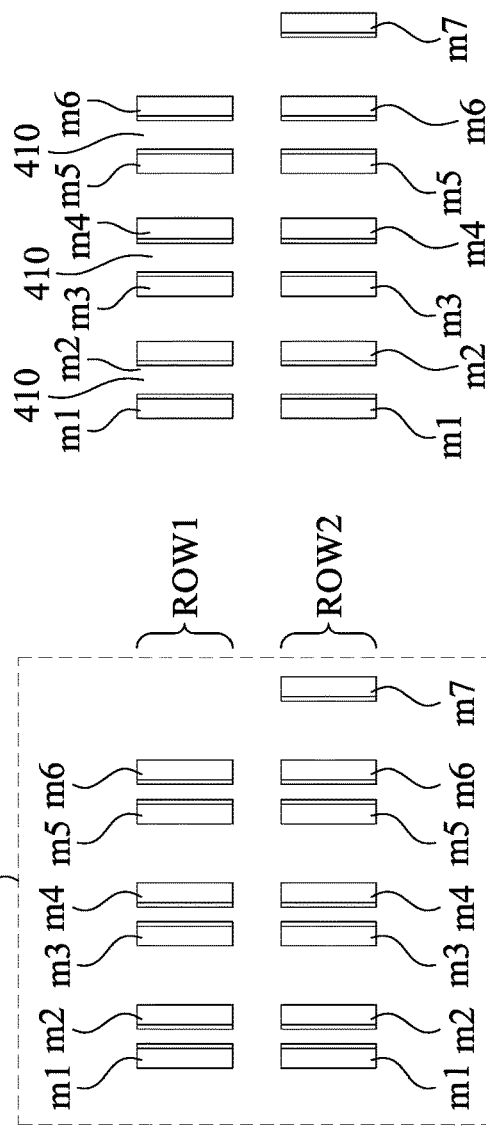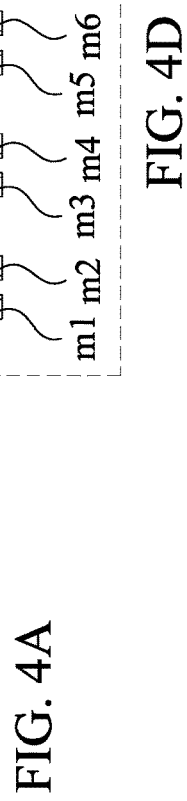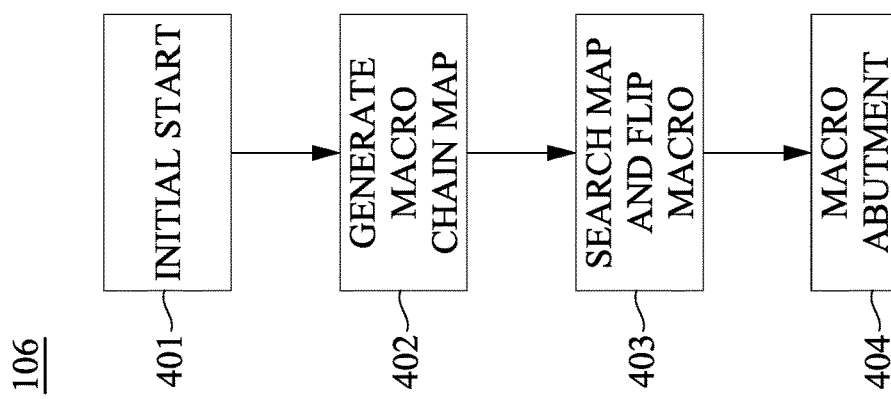

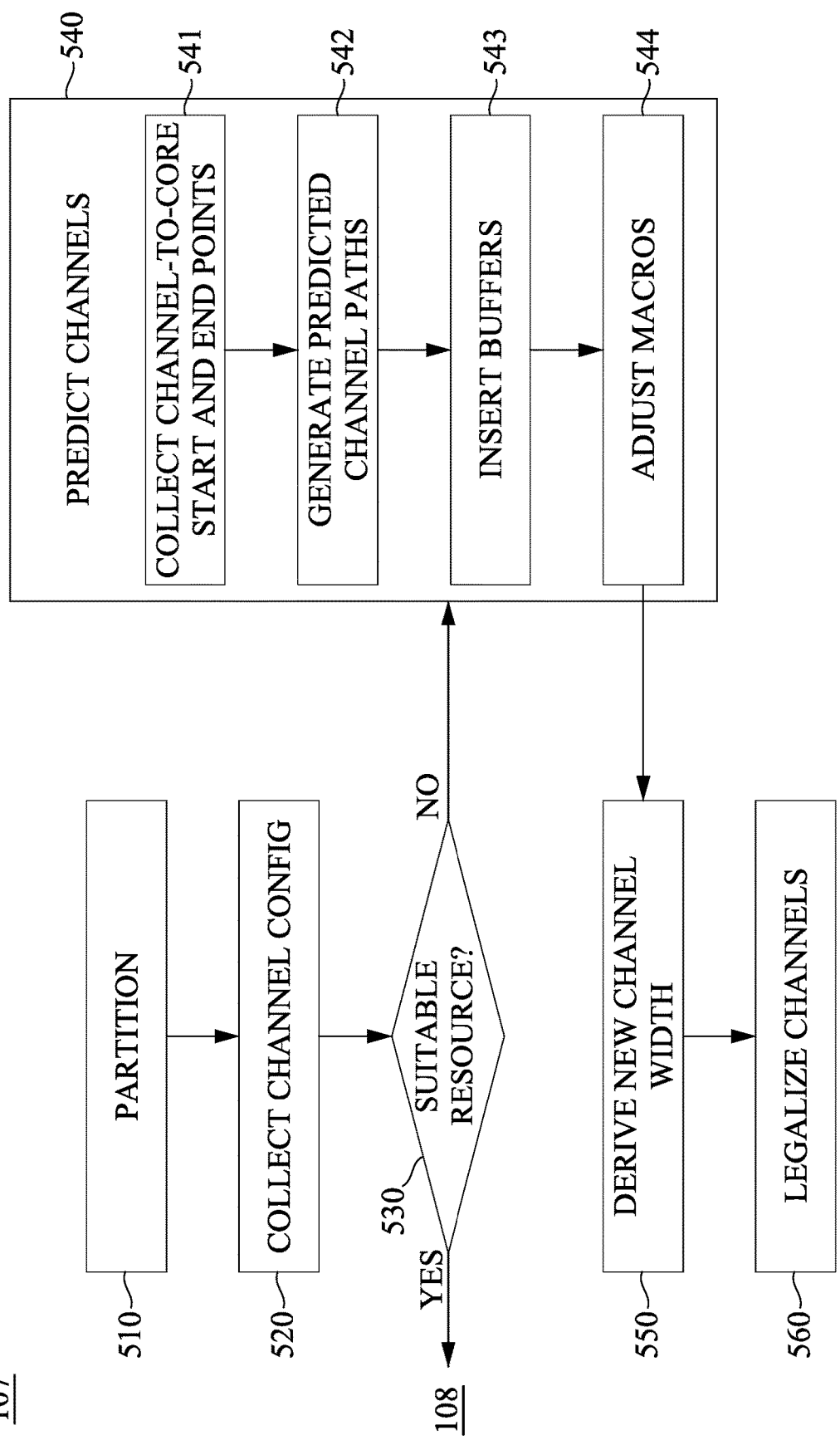

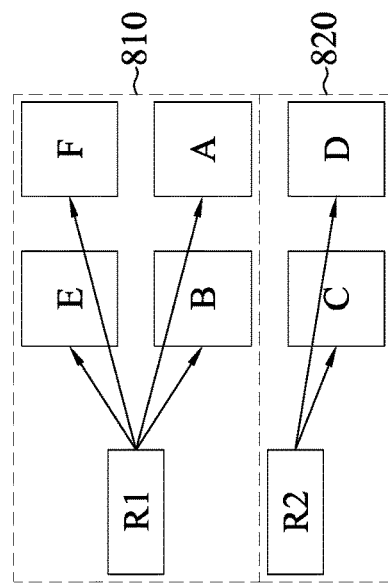
FIG. 8E
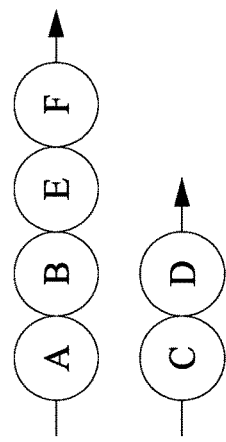
FIG. 8C
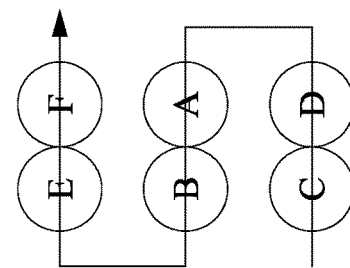
FIG. 8D
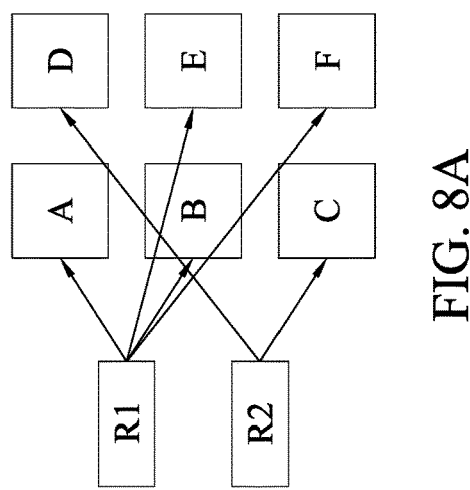
FIG. 8A
|   | A | B | C | D | E | F |
|---|---|---|---|---|---|---|
| A | - | - | - | - | - | - |
| B | 1 | - | - | - | - | - |
| C | 0 | 0 | - | - | - | - |
| D | 0 | 0 | 1 | - | - | - |
| E | 1 | 1 | 0 | 0 | - | - |
| F | 1 | 1 | 0 | 0 | 1 | - |
FIG. 8B

METHOD FOR OPTIMIZING FLOOR PLAN FOR AN INTEGRATED CIRCUIT

CROSS-REFERENCE

The present application is a continuation application of U.S. application Ser. No. 17/071,862, filed Oct. 15, 2020, now U.S. Pat. No. 11,443,096, issued Sep. 13, 2022, which claims priority to China Application Serial Number 202010996475.6 filed on Sep. 21, 2020, which is herein incorporated by reference in its entirety.

BACKGROUND

In an electronic circuit design process, one or more electronic design automation (EDA) tools may be utilized to design, optimize, and verify semiconductor device designs, such as circuit designs in a semiconductor chip. The first and most important task in physical design is floorplanning, which determines memory macro locations to optimize high-level circuit module locations. However, most floorplanning works currently still heavily rely on manual works and requires smart automation. After floorplanning, the design will go through placement and routing major stages. During placement, a placer tool may produce a placement layout based on a given circuit design, which may be developed by a circuit designer and which may include, for example, circuit design information such as electrical diagrams, high level electrical description of the circuit design, a netlist, or the like. The placement layout includes information indicating physical positions of various circuit elements of the semiconductor device. After the placement of the device is completed, routing may be performed. During routing, wires or interconnections may be formed to connect the various circuit elements of the placement layout. After routing, the resulting electronic device designs are checked for compliance with various design rules, design specifications, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is flow chart of an example in an orientation optimization stage of the method of FIG. 1, in accordance with some embodiments.

FIGS. 4B-4E are schematic diagrams of examples corresponding to the orientation optimization stage of FIG. 4A, in accordance with some embodiments.

FIG. 5 is detailed flow chart of an example in a channel resource detection stage of the method of FIG. 1, in accordance with some embodiments.

FIGS. 8A-8E are schematic diagrams of examples corresponding to the dataflow macro adjustment stage of FIG. 7, in accordance with some embodiments.

DETAILED DESCRIPTION

Figure 1:
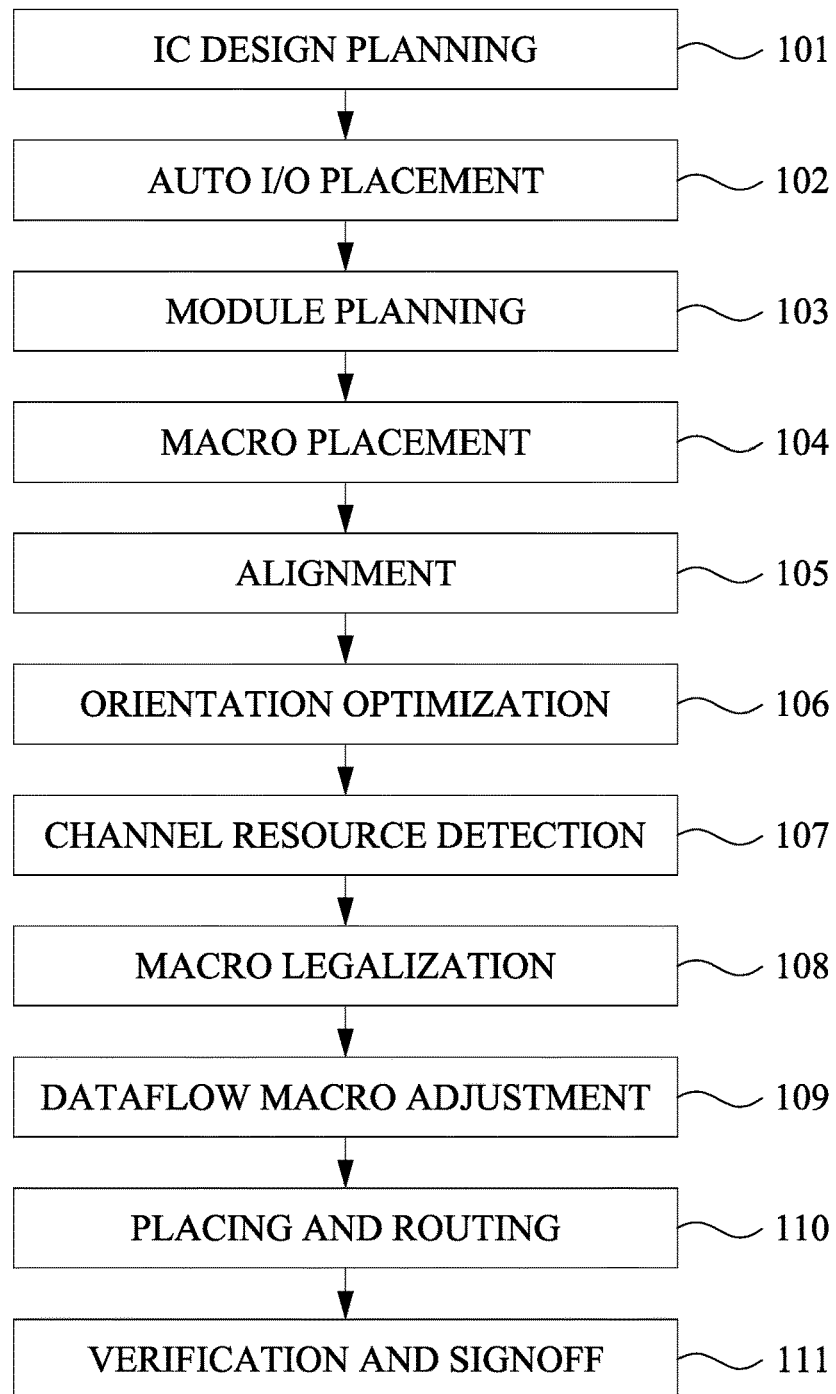
FIG. 1 is a flow chart of a method of designing a layout for an integrated circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Electronic design automation (EDA) software tools provide a variety of functions related to design, simulation, analysis, verification, and manufacturing of integrated circuits (ICs). Advances in computing speed and power, as well as memory capacity, have reduced the amount of time required to complete such functions. Simultaneously, increased design complexity (number of devices and interconnections there between) and more rapid design cycles cause IC designers to rely more heavily on EDA software tools to produce IC layouts that perform correctly while meeting time-to-market goals. However, current EDA tools have major insufficiencies to support practical implementation. For example, setting many parameters is needed to obtain feasible options of floor plans. The EDA tools do not support (1) fine-grain module planning, (2) macro pin orientation, (3) channel space optimization, (4) fine-grain dataflow placement as well. The present disclosure in various embodiments provides a system and a method for generating floor plans with reduced manual efforts.

Reference is now made to FIG. 1. FIG. 1 is a flow chart of a method 100 of designing a layout for an integrated circuit, in accordance with some embodiments of the present disclosure. It is understood that additional operations/stages can be provided before, during, and after the processes shown by FIG. 1, and some of the operations/stages described below can be replaced or eliminated, for additional embodiments of the method 100. The method 100 includes stages 101-111.

In some embodiments, the design flow aims at implementing the integrated circuit chip design from a high-level specification to a physical layout which is verified for, for example, functionality, timing and power. The design flow utilizes one or more electronic device design tools in a system to carry out one or more stages in the flow. In some embodiments, the electronic device design tools are implemented at least in part as software tools which, when executed by one or more computing devices, processors, or the like, can be utilized to design and generate one or more electronic device layouts, including placement layouts and associated routing for electronic devices circuits, which may include, for example, the integrated circuit. In some embodiments, the electronic device design tools are included in or otherwise implemented by a same apparatus, such as a same computing system or device. In other embodiments, the electronic device design tools are included in or otherwise implemented by separate apparatuses, such as separate and remotely located computing systems or devices.

Referring to FIG. 1, at an IC design planning stage 101, a high-level design of the integrated circuit is provided by a circuit designer. In some embodiments, a gate-level netlist is generated through logic synthesis based on the high-level design and gates in the gate-level netlist are mapped to available cells in a standard cell library. The term "netlist" used herein refers to graphical-based representation such as a schematic or a text-based representation of a circuit or both. In electronic design, a netlist is a description of the connectivity of an electronic circuit. A single netlist is effectively a collection of several related lists. In its simplest form, a netlist consists of a list of the terminals ("pins") of electronic components in a circuit and a list of electrical conductors that interconnect the terminals. A net is a conductor that interconnects two or more component terminals.

At an auto input/output (I/O) placement stage 102, an I/O region of the integrated circuit is placed automatically by the system accordingly to some design parameters. In some embodiments, the I/O region provides an electrical interface between a core region of the integrated circuit and external circuitries. In some embodiments, the I/O region is frequently called an I/O ring because it contains I/O circuit macros (or cells or modules) that are laterally connected together to form a generally continuous rectangle that is wrapped around the perimeter of the core region. The I/O macro lateral connections are used to efficiently distribute I/O and core power and ground supplies to the I/O macros and thus minimize noise and maximize electrostatic discharge (ESD) protection. The I/O macros contain the interface circuitry for higher supply voltage external signals and for lower supply voltage core signals. I/O macros are typically connected to bond pads that in turn are connected to external pins, leads or solder bumps on the IC's package. In various embodiments, a number of I/O cell libraries have become standardized and are widely used in many different IC designs.

At a module planning stage 103, the gate-level netlist is partitioned into functional blocks in the core region and a floor plan for the functional blocks in a design layout of the integrated circuit is created.

At a macro placement stage 104, mapped cells of logic gates and registers in the blocks are placed at specific locations in the design layout. In some embodiments, various logic, memory, or processor cell macros are included in the core region of the integrated circuit.

In some embodiments, after the module planning stage 103 and the macro placement stage 104, locations of the macros are determined and multiple objects, for example, the routing elements, are optimized. The system is further configured to optimize routability factors to generate multiple floor plans. Specifically, in some embodiments, a list of floor plans with specific features, for example, half-perimeter wire length (HPWL), waste area, etc., is created automatically by the system and rankings of cost for the floor plans are provided for further selection. In various embodiments, the floor plans are generated with module timing consideration and included in a data farm.

In some approaches, preparation of the floor plans relies on manual work heavily, and therefore consumes a bunch of time. Furthermore, floor plan design sometimes is limited by designers' skills and understandings. In contrast, with the configurations of various embodiments of the present disclosure, multiple floor plans are generated automatically and categorized by several factors. Accordingly, flexibility for selecting and optimizing is provided.

Referring to FIG. 1 again, at an alignment stage 105, the macros are aligned to adjacent macros automatically by the system. In some embodiments, aligned macros provide better routability for nearby channels.

At an orientation optimization stage 106, a chain map for pins of the macros arranged in the same row is generated. A portion of the pins are further flipped according to the chain map and the locations of the nearby channels. In some embodiments, the pins of the macros face the channel interposed therebetween.

At a channel resource detection stage 107, required paths for the channels are estimated and sufficient widths of the channels are calculated. In some embodiments, a machine learning unit is implemented with path-tracing algorithm. Adjustment to the channels and the macros nearby the channels is made on the basis of floor plan guidelines and the results of the channel resource detection.

At a macro legalization stage 108, a large amount of macro legalizations for complicated floor plan shapes to meet technology guideline rules are enabled. In some embodiments, after the macro legalization stage 108 the floor plans violate no guideline.

At a dataflow macro adjustment stage 109, the macros are re-arranged according to correlations between the macros and coupled registers. In some embodiments, the macros are arranged closer to the register coupled thereto, compared with macros not coupled to that corresponding register.

At placing and routing stage 110, for example, generating a placement layout is performed. In some embodiments, the placement layout includes standard cells which correspond to, or otherwise implement, the one or more logic operations, one or more arithmetic operations, one or more control operations, or the like produced by a synthesis tool. The standard cells may include or be provided as geometric shapes (such as cells STD1-STD3 shown in FIG. 6A). Furthermore, routing is performed on the placement layout. For example, routing on the placement layout is implemented by generating interconnections (or routings) between the standard cells, the macros or the geometric shapes in the placement layout. After routing, an integrated circuit layout is produced which includes, for example, the placement layout and the interconnections provided by the routing.

At a verification and signoff stage 111, the integrated circuit layout is checked to ensure correspondence to the gate-level netlist, and to ensure clean of, for example, electrical issues and lithographic issues for manufacturing. Incremental fixing can be performed to achieve final signoff of the design before tape-out.

The flow chart of the method 100 in FIG. 1 is given for illustrative purposes. Various implements of the method 100 are within the contemplated scope of the present disclosure. For example, in other embodiments, the alignment stage 105 is also implemented after the orientation optimization stage 106 and the macro legalization stage 108.

Figure 2:
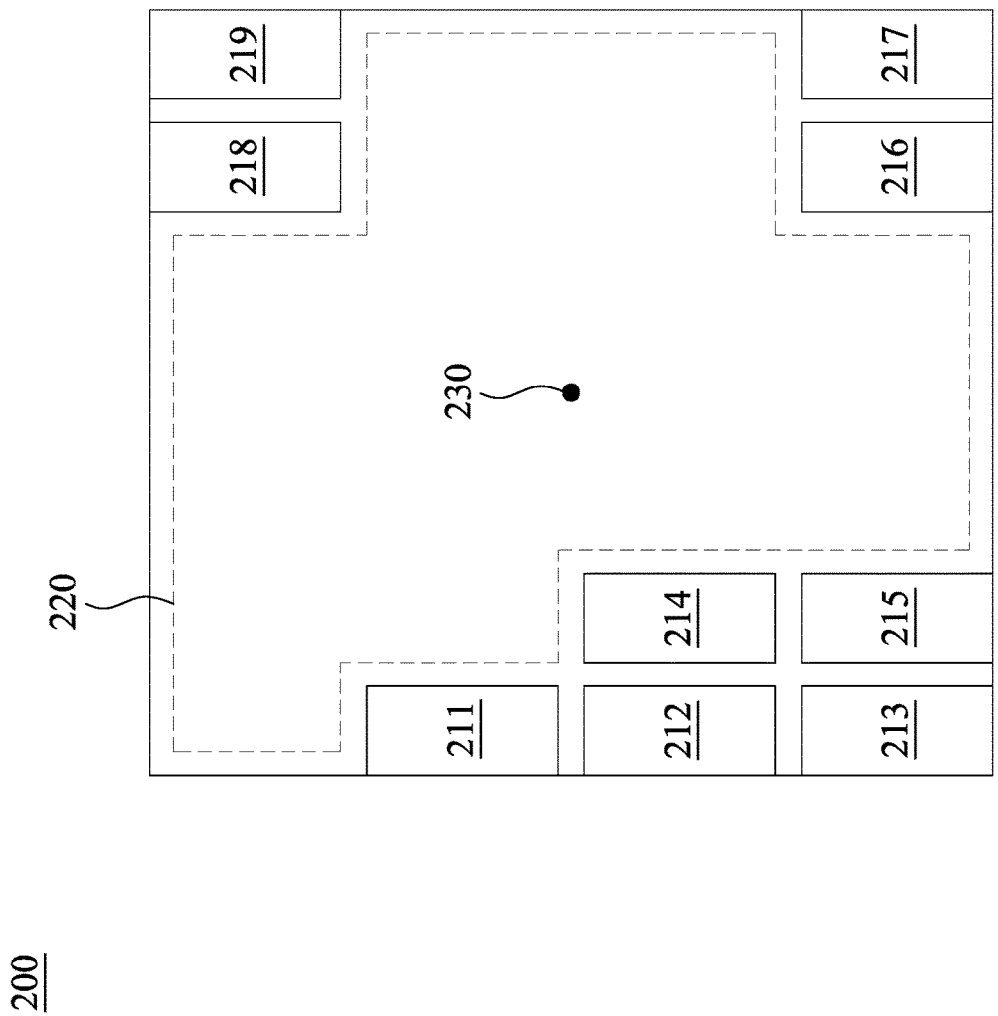
FIG. 2 is a schematic diagram of part of a floor plan of an integrated circuit, in accordance with some embodiments.

Reference is now made to FIG. 2. FIG. 2 is a schematic diagram of part of a floor plan 200 of an integrated circuit, in accordance with some embodiments. In some embodiments, FIG. 2 corresponds to the macro placement stage 104 of FIG. 1 Alternatively stated, the floor plan 200 is generated through the stages 101-104 of FIG. 1. As illustratively shown in FIG. 2, the floor plan 200 includes macros 211-219 formed in groups. A logic boundary 220 is shown, and within the logic boundary 220 one or more registers (not shown) is placed, in some embodiments. A centroid 230 is located in the logic boundary. In some embodiments, the centroid 230 indicates a center of a core region of part of the integrated circuit of the floor plan 200.

For illustration, the macros 211-215 are arranged at a bottom left corner. The macros 216-217 are arranged at a bottom right corner. The macros 218-219 are arranged at a top right corner. As shown in FIG. 2, the macros 211 and 214 are placed closer to the centroid 230 than the macros 212-213 and 215. The macro 216 is placed closer to the centroid 230 than the macro 217. The macro 218 is placed closer to the centroid 230 than the macro 219.

In some embodiments, the macros 211-219 are placed according to weights of the macros 211-219. Specifically, in the macro placement stage 104, the method includes placing the macros 211-219 in the floor plan 200 on the basis of a comparison of the weights of the macros 211-219. Each of the weights of the macros 211-219 correspond to a connection relationship of one of the macros 211-219. In some embodiments, the weight is calculated by, for example, the equation (1) shown as below:

$$\text{weight} = (\text{Fanout\_}icg + \text{Fanin\_}icg) \times c1 + (\text{Fanout\_reg} + \text{Fanin\_reg}) \times (\text{stage}M2R + \text{stage}R2M) \times c2 \quad (1)$$

Fanout_icg indicates a number of fan-out points for passing one or more signals from a macro to one or more cells (i.e., one or more gate cells). Fanin_icg indicates a number of fan-in points for passing one or more signal from one or more cells to the macro. Fanout_reg indicates a number of fan-out points for passing one or more signals from the macro to one or more registers. Fanin_reg indicates a number of fan-in points for passing one or more signals from one or more registers to the macro. StageM2R indicates a number of stages from the macro to the coupled one or more registers. StageR2M indicates a number of stages from the coupled one or more registers to the macro. Coefficients c1-c2 are determined according to the design of the integrated circuit or implements of the present disclosure.

For example, a macro is coupled to 4 cells to receive signals and outputs signals to 5 cells. Fanin_icg equals to 4 and Fanout_icg equals to 5. The macro is coupled to 1 register (i.e., a first register) to receive signals and outputs signals to 1 register (i.e., a second register). Fanin_reg equals to 1 and Fanout_reg equals to 1. In addition, the macro is directly coupled to the first register without any element coupled in between, and stageR2M equals to 1. The macro is coupled to the second register through 1 element, and stage M2R equals to 2. The coefficients c1 and c2 equal to 1.3 and 1.0 respectively. Accordingly, the weight of the macro equals to 17.7.

Based on the discussions above, in the macro placement stage 104, the method includes comparing the weights of the macros. For example, in some embodiments, the weights of the macros 211 and 214 are greater than the weights of the macros 212-213 and 215. The weight of the macro 216 is greater than that of the macro 217. The weight of the macro 218 is greater than that of the macro 219. Accordingly, as illustratively shown in FIG. 2, those macros having greater weights (i.e., the macros 211, 214, 216, and 218) in the groups are arranged closer to the centroid 230 than the macros having smaller weights (i.e., the macros 212-213, 215, 217, and 219.)

The configurations of FIG. 2 are given for illustrative purposes. Various implements are within the contemplated scope of the present disclosure. For example, in some embodiments, the coefficients c1-c2 are different from 1.3 and 1.0.

Figure 3A:
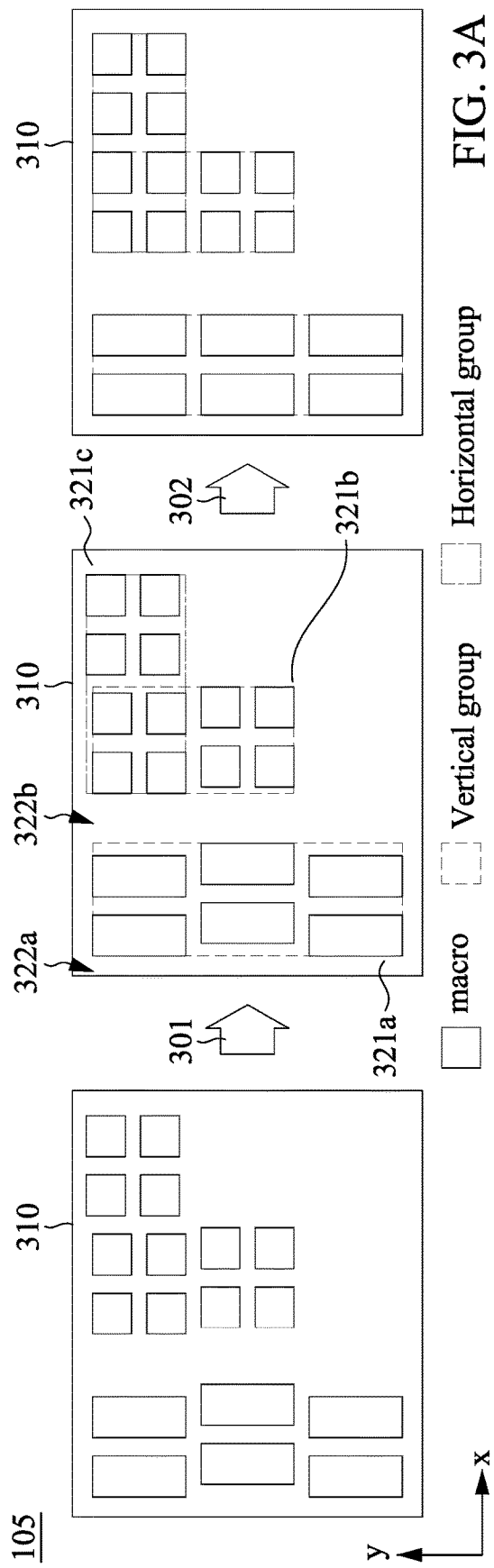
FIG. 3A is flow chart of an example in an alignment stage of the method of FIG. 1, in accordance with some embodiments.

Reference is now made to FIG. 3A. FIG. 3A is flow chart of an example in the alignment stage 105 of the method 100 of FIG. 1, in accordance with some embodiments. As shown in FIG. 3A, a floor plan 310 includes several macros.

For illustration, in the alignment stage 105, the method 100 includes operations 301-302. In operation 301, group boxes 321a-321c are defined for the macros in the floor plan 310. Alternatively stated, the macros in the floor plan 310 are organized into the group boxes 321a-321c. As shown in FIG. 3A, in some embodiments, the group boxes 321a and 321b extend in y direction and the group box 321c extends in x direction.

The floor plan 310 further includes channels 322a-322b. For illustration, the channels 322a-322b extend in y direction, and the channel 322b is interposed between the group boxes 321a-321b.

In some embodiments, the group boxes 321a-321c are defined according to the channels 322a-322b. For example, firstly, starting from the channel 322a, a first macro is found. Secondly, searching, based on the first macro, for macros in a range of about 3-5 micrometers is performed until there is no macro in the range. Accordingly, as shown in FIG. 3A, 6 macros are organized in the group box 321a, 8 macros are organized in the group box 321b, and 8 macros are organized in the group box 321c.

In operation 302, aligning the macros in the group boxes 321a-321c is performed to minimize heights and/or widths of the group boxes 321a-321c. For example, the macros in the group boxes 321a-321b are moved to minimize the widths of the group boxes 321a-321b. The macros in the group box 321c are moved to minimize the height of the group box 321c. In some embodiments, for the macros included in both of the group boxes 321b-321c, the alignment to the group box 321b is performed before the alignment for the group box 321c. In various embodiments, the alignment for the group box 321b is performed after the alignment to the group box 321c.

Figure 3B:
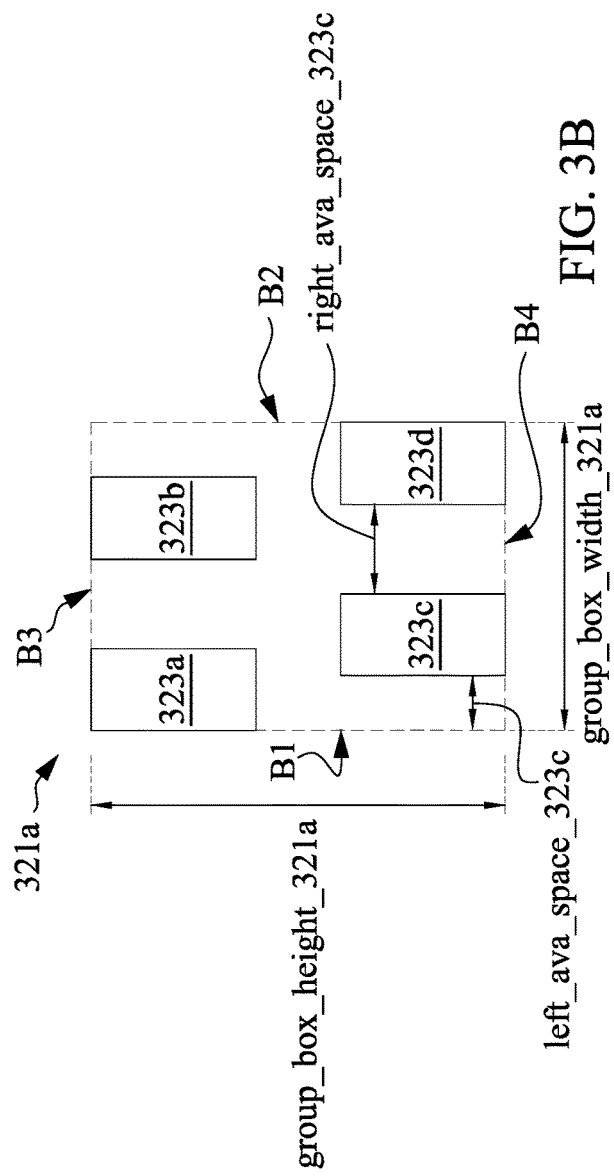
FIG. 3B is a schematic diagram of a group box corresponding to FIG. 3A, in accordance with some embodiments.

Reference is now made to FIG. 3B. FIG. 3B is a schematic diagram of the group box 321a corresponding to FIG. 3A, in accordance with some embodiments. For illustration, the group box 321a has a height group_box_height_321a and a width group_box_width_321a, and the group box 321a has four boundaries B1-B4. The boundaries B1-B2 extend in y direction and the boundaries B3-B4 extend in x direction. Compared with FIG. 3A, instead of having six macros, the group box 321a includes macros 323a-323d.

In some embodiments, at the alignment stage 105, the macros 323a-323d in the group box 321a are moved, and movements of the macros 323a-323d range between a first space and a second space. In some embodiments, a movement $\Delta$Macro of the macro is presented in an equation (2) shown as below:

$$-\text{left\_ava\_space}_{(i,j)} \le \Delta\text{Macro}_{(i,j)} \le c3 \times \text{right\_ava\_space}_{(i,j)} \quad (2)$$

The movement $\Delta$Macro has a negative number while the macro is moved left. The first space left_ava_space$_{(i,j)}$ corresponds a space between a macro j (i.e., one of the macros 323a-323d) in a group box i (i.e., the group box 321a) and the left boundary B1 or another adjacent macro. The second space right_ava_space$_{(i,j)}$ corresponds a space between the macro j and the right boundary B2 or another adjacent one of the macros. The coefficient c3 is a given number and associated with a space between the macro and the boundaries B1-B4. For example, in some embodiments, the macro 323a is about to be moved right. Because the space between the macro 323a and the boundary B2 and the space between the macro 323b and the boundary B2 are sufficient, there is still room for the macro 323b to be moved right when the movement $\Delta$Macro of the macro 323a is the second space right_ava_space (the space between the macros 323a-323b). Accordingly, the coefficient c3 is set as 1. In various embodiments, since the spaces between macros and boundaries are not sufficient, the coefficient c3 is about 0.5.

For example, as illustratively shown in FIG. 3B, a space left_ava_space_323c indicates a space between the boundary B1 and the macro 323c. A space right_ava_space_323c indicates a space between the macros 323c-323d. In some embodiments, the macro 323c is moved left to align with the boundary B1, and the macro 323d is moved left correspondingly. Hence, the boundary B2 is shifted left and the width group_box_width_321a is minimized. In some embodiments, at the alignment stage 105, different ways of adjusting the locations of the macros are estimated by an integer linear programming (ILP) tool, and one of the ways is selected to have a minimum total of the movements of the macros 323a-323d. Alternatively stated, the macros 323a-323d are adjusted according to an estimate minimum total of the movements of the macros 323a-323d.

In some embodiments, movements of macros in the group box 321c range between a third space and a fourth space. In some embodiments, a movement $\Delta$Macro of the macro is presented in an equation (3) shown as below:

$$-\text{bottom\_ava\_space} \le \Delta\text{Macro} \le c4 \times \text{top\_ava\_space} \quad (3)$$

The movement $\Delta$Macro has a negative number while the macro is moved down. The third space bottom_ava_space corresponds a space between a macro in a group box (i.e., the group box 321c) and the bottom boundary B4 or another macro. The fourth space top_ava_space corresponds a space between the macro and the top boundary B3 or another one of the macros. The configurations of the coefficient c4 are similar to that of the coefficient c3. Thus, the repetitious descriptions are omitted here.

The configurations of FIGS. 3A-3B are given for illustrative purposes. Various implements are within the contemplated scope of the present disclosure. For example, in some embodiments, the searching ranges various with the implements of the present disclosure.

Reference is now mode to FIG. 4A. FIG. 4A is flow chart of an example in the orientation optimization stage 106 of the method 100 of FIG. 1, in accordance with some embodiments. For illustration, the method 100 further includes operations 401-404 at the orientation optimization stage 106. For ease of understanding, the operations 401-404 are discussed along with FIGS. 4B-4E. FIGS. 4B-4E are schematic diagrams of examples corresponding to the orientation optimization stage 106 of FIG. 4A, in accordance with some embodiments.

In operation 401, as shown in FIG. 4B, macros are arranged in two rows. Each pin of the macros are initialized to the same direction, for example, a row direction.

In operation 402, as shown in FIG. 4C a first chain map is generated for the macros m1-m6 in a row ROW1, and a second chain map is generated for the macros m1-m7 in a row ROW2 below the row ROW1. In some embodiments, an adjacency list is built for each macro in a row. For example, the adjacency list of the macro m1 in the row ROW1 is given as [m2, m3, m4, m5, m6], and the adjacency list of the macro m6 in the row ROW1 is given as [None]. The adjacency list of the macro m1 in the row ROW2 is given as [m2, m3, m4, m5, m6, m7], and the adjacency list of the macro m7 in the row ROW2 is given as [None].

In operation 403, searching the chain maps and flipping corresponding macros in rows to change orientations of pins of the corresponding macros are performed. In some embodiments, a depth first search (DFS) is performed. For example, for the macros in the row ROW1, in response to searching the first chain map, the macros m2, m4, and m6 are flipped and the pins of the macros m2, m4, and m6 face the pins of the macros m1, m3, and m5 separately, as shown in FIG. 4D. Alternatively stated, the pins of the macros m1-m2 face each other, and so on.

Moreover, when a number of the macros is an odd number and a macro of the macros is adjacent a boundary of a floor plan, an orientation of a pin of the macro is arranged opposite of the boundary of the floor plan. For illustration, as shown in FIG. 4D, the number of the macros in the second chain map is an odd number 7. The macro m7 in the row ROW2 is adjacent a boundary of a floor plan 400, and accordingly, an orientation of the pin of the macro m7 in the row ROW2 is arranged opposite of the boundary of the floor plan 400.

In operation 404, adjustment to macro abutment is performed. As shown in FIG. 4E, two adjacent macros, for example, the macros m1-m2 in the row ROW1, having face-to-face pins are separated by a channel width of a channel area 410 interposed between the macros m1-m2. Alternatively stated, the macros m1-m2 are arranged on opposite side of the channel area 410, in which the macros m1-m2 and the channel area 410 extend in the same direction. To further explain in another way, the pins of the macros shown in FIG. 4E are adjusted according to the channel areas 410 interposed between the macros.

In some embodiments, the channel area 410 includes a channel structure, and the pins of the macros m1-m2 in the row ROW1 are coupled to the channel structure in the channel area 410. The configurations of the macros m1-m6 in the row ROW1, the macros m1-m7 in the row ROW2, and the channel areas 410 are similar to that of the macros m1-m2 and the channel interposed therebetween. Hence, the repetitious descriptions are omitted here.

In some approaches, orientations of pins of macros in a floor plan are not optimized, and therefore induce the complexity of channel routing and a waste of chip areas. In contrast, with the configurations of the present disclosure, orientations of pins of macros are aligned to each other and placed according to the channel areas for channel routing. Accordingly, better efficiency of chip areas is provided, compared with some approaches.

The configurations of FIGS. 4A-4E are given for illustrative purposes. Various implements are within the contemplated scope of the present disclosure. For example, in some embodiments, there are more than two rows macros arranged in the floor plan 400 and pins of macros are adjusted correspondingly.

Reference is now made to FIG. 5. FIG. 5 is detailed flow chart of an example in the channel resource detection stage 107 of the method 100 of FIG. 1, in accordance with some embodiments. For illustration, at the channel resource detection stage 107, the method 100 includes operations 510-560. In some embodiments, the operations 510-560 are performed by a channel resource alarm system having a channel statistic generation unit. The channel resource alarm system is configured to estimate spaces or resources for channel routing in the integrated circuit by implementing machine learning and deep learning. For ease of understanding, the operations 510-560 are discussed with reference to FIGS. 6A-6E. FIGS. 6A-6E are schematic diagrams of examples corresponding to the channel resource detection stage 107 of FIG. 5, in accordance with some embodiments. Like elements in FIGS. 6A-6E are designated with the same reference numbers for ease of understanding.

In operation 510, several standard cells are partitioned. For example, as shown in FIG. 6A, standard cells STD1-STD3 and macros are included in a floor plan 600. In some embodiments, the standard cells STD1-STD3 described herein refer to predefined circuit units or circuit elements that are provided, as part of a cell library of many different types of circuit units, to an integrated circuit designer. For example, a standard cell is an inverter, a NAND gate, a NOR gate, a flip flop, or other similar logic circuit. Each standard cell has a boundary, essentially consisting of four edges that form a rectangular shape. As used herein, a standard cell refers to a cell with a predefined layout that is used in conjunction with other standard cells to implement a desired functionality of an integrated circuit. In some embodiments, standard cells have fixed active and gate level geometries.

In operation 520, channel configurations of the floor plan 600 are collected. As illustratively shown in FIG. 6A, a channel area CH is arranged interposed between 8 macros placed on the left of the standard cells STD1-STD2 and above the standard cell STD3. In some embodiments, the channel area CH is referred to as a predicted channel for routing. The channel area CH has a width W1, as shown in FIG. 6A.

In some embodiments, the configurations of all channels between the macros in the floor plan 600 are collected and further all macros are adjusted at the channel resource detection stage 107. The present disclosure is not limited to FIGS. 5-6E.

In operation 530, a determination of routing resource is made based on the width W1. When the width W1 is suitable for further routing, and then the following operations at the macro legalization stage 108 are performed. In contrast, if the width W1 is not wide enough, the operation 540 is performed. In some embodiments, the operation of determining includes checking a predicted routing result based on the width W 1, and a number of routing congestion (i.e., hotspots) indicates whether the routing resource is sufficient.

In operation 540, one or more channels for routing are predicted. As shown in FIG. 5, the operation 540 includes operations 541-544. In some embodiments, the operation 541 is performed after the operation 530, and the operation 550 is performed after the operation 544.

Figure 6B:
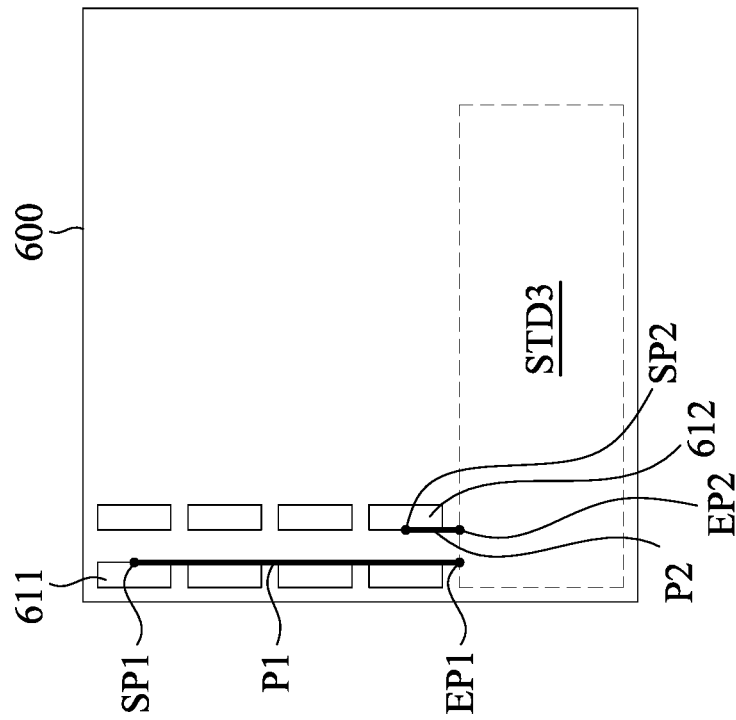
FIGS. 6A-6E are schematic diagrams of examples corresponding to the channel resource detection stage of FIG. 5, in accordance with some embodiments.
Figure 6A:
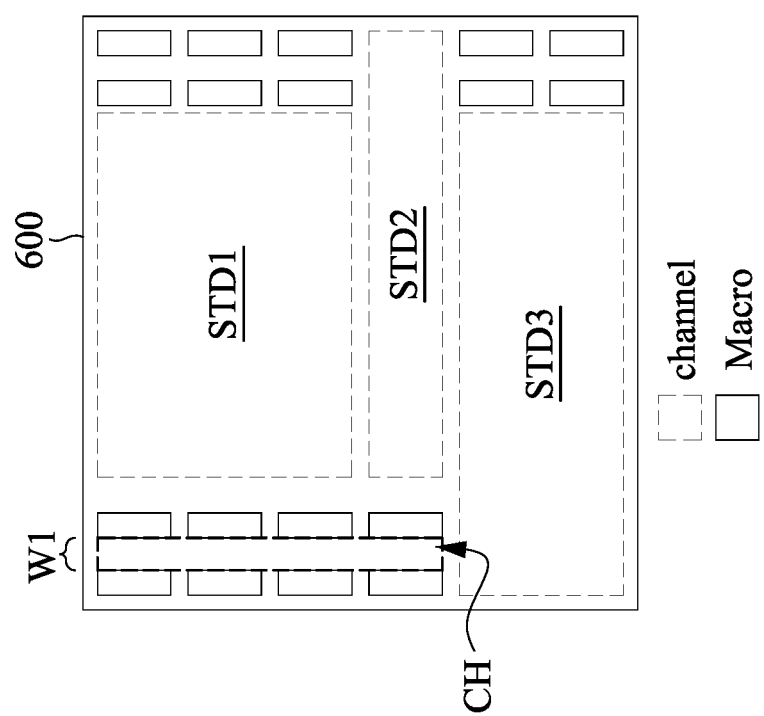

In operation 541, as shown in FIG. 6B, starts points SP1-SP2 and end points EP1-EP2 are collected. For the sake of brevity, the standard cells STD1-STD2 and other macros are omitted in FIG. 6B. In some embodiments, the starts points SP1-SP2 are determined as reference points on pins of the macros 611-612 respectively. The standard cell STD3 is found to be the nearest standard cell for the macros 611-612 along the channel area CH. Accordingly, the end points EP1-EP2 are determined on an edge of the standard cell STD3.

In operation 542, one predicted channel path for each macro in the floor plan 600 is generated. In some embodiments, a machine learning unit adopts a path tracing algorithm with reinforcement learning (i.e., deep Q learning) to determine the shortest path between start points and end points. For illustration, as shown in FIG. 6B, a channel path P1 extends from the start point SP1 to the end point EP1 and is the shortest path for the macro 611 between the start point SP1 to the end point EP1. A channel path P2 extends from the start point SP2 to the end point EP2, and is the shortest path for the macro 612 between the start point SP2 to the end point EP2. Alternatively stated, the direction in which the shortest path extends is the direction in which a predicted channel for a macro extends. For the sake of brevity, predicted channel paths for other macros are omitted in FIG. 6B.

Figure 6D:
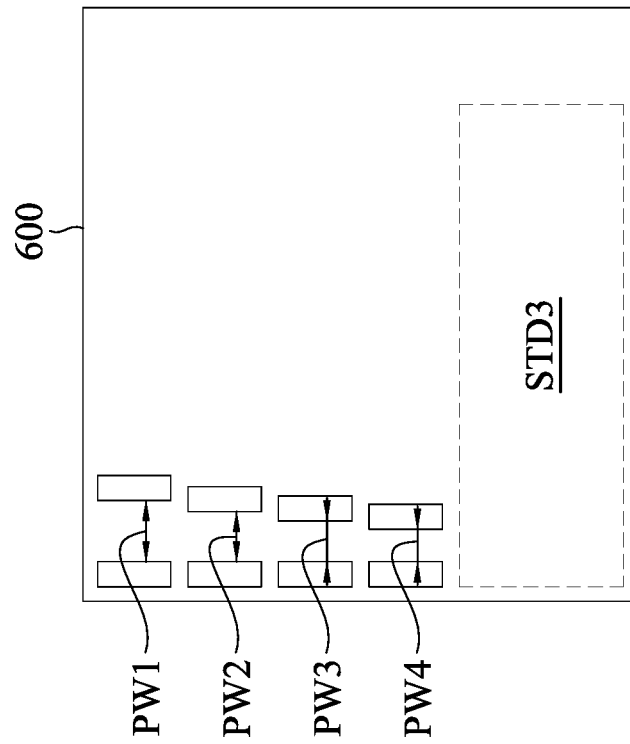
Figure 6C:
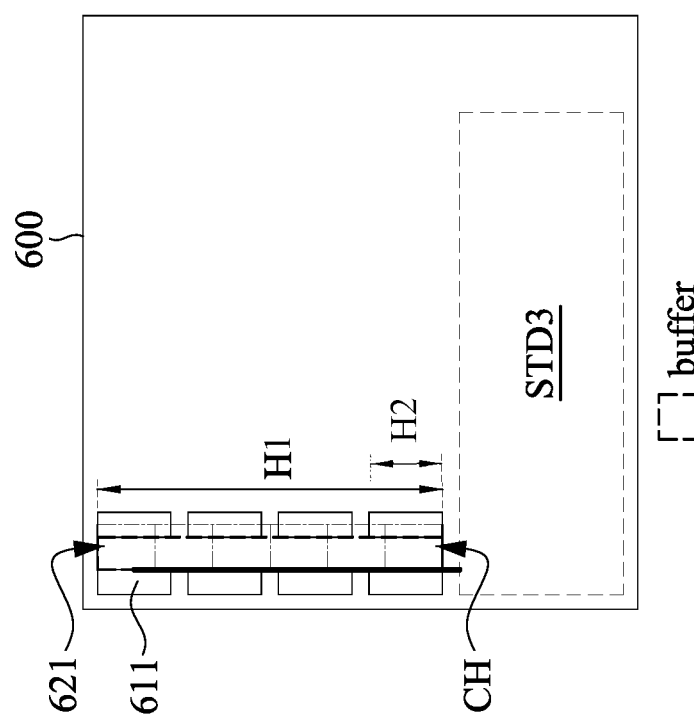

In operation 543, a number N_buffer of buffers predicted to be inserted for one macro in the channel area CH is estimated according to the predicted path. Taking the macro 611 as example, in some embodiments, as shown in FIG. 6C, buffers 621 are arranged along the predicted path. An area A_buffer of each of the buffers 621 varies according to the implements of the present disclosure. Accordingly, if the total area of the buffers 621 is greater than the area of the channel area CH, the channel width of the channel area CH is determined to be enlarged with a predicted channel width. In some embodiments, the predicted channel width PW is calculated based on an equation (4) shown as below:

$$PW = \frac{\text{N\_buffer} \times \text{A\_buffer}}{\text{Hchannel}} \quad (4)$$

A height Hchannel is the height of the channel area CH corresponding to the macro, as shown in FIG. 6C. For example, for the macro 611, the height Hchannel equals to H1, and for the macro 612, the height Hchannel equals to H2. For the sake of brevity, predictions of channel widths for other macros are omitted in FIG. 6C.

In some embodiments, each buffer is generally a driver circuit constructed to provide one or more signal (i.e., a bit line signal, a word line signal, or power signal, and so on) to drive one or more macros. Accordingly, a buffer having greater driving ability occupies a greater area than those having smaller driving ability.

In operation 544, each macro is adjusted according to a corresponding predicted channel width. For illustrations, as shown in FIG. 6D, in some embodiments, the macros at different locations are separated by different predicted channel widths PW1-PW4.

Figure 6E:
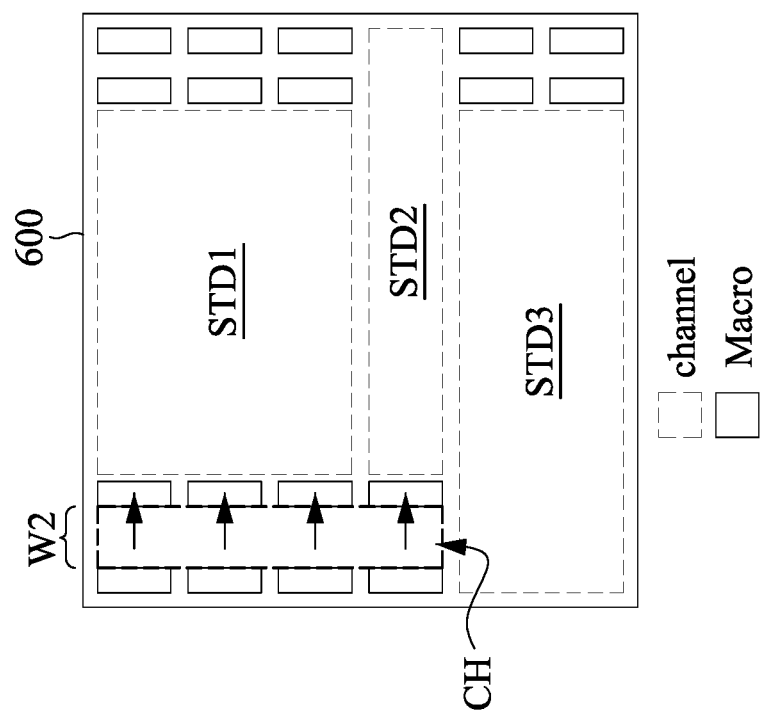

In operation 550, a new channel width is determined according to the predicted channel widths. For example, as shown in FIG. 6E, a channel width W2 is determined for all macros. In some embodiments, the largest predicted channel width among predicted channel widths is selected for the final channel width W2. In various embodiments, the channel width W2 is determined and/or adjusted according to the predicted channel widths and other factors, for example, detecting a power switch (i.e., a header or a footer) in the floor plan.

In operation 560, as shown in FIG. 6E, the channel area CH is adjusted to have the channel width W2 through moving the macros right. In some embodiments, the operation 560 is referred to as channel legalization. In some embodiments, macro alignment operation is performed to macros after channel legalization.

In some approaches, without the channel resource detection stage 107 for predicting sufficient channel widths, total of congestion hotspots while simulating is about 24069.46 and the timing paths of R2R (register-to-register) and M2M (macro-to-macro) are about 1.937 GHz and 1.565 GHZ respectively. In contrast, with the configurations of the present disclosure, total of congestion hotspots decreases about 51.9% (about 11573.29). The timing path of R2R increases about 0.8% (about 1.953 GHZ), and the timing path of M2M increases about 3.9% (about 1.626 GHZ).

The configurations of FIGS. 5-6E are given for illustrative purposes. Various implements are within the contemplated scope of the present disclosure. For example, in some embodiments, according to the channel prediction, the new channel width W2 is smaller than the channel width W1, and the macros are moved left. For instance, in some embodiments, the original width is about 10 micrometers. After the channel prediction, the width becomes about 9.3 micrometers with a header in the floor plan and becomes 5.3 micrometers without a header. Accordingly, with the configurations of the present disclosure, the smaller width is obtained and better efficiency of chip area is provided, compared with some approaches without the channel prediction.

Figure 7:
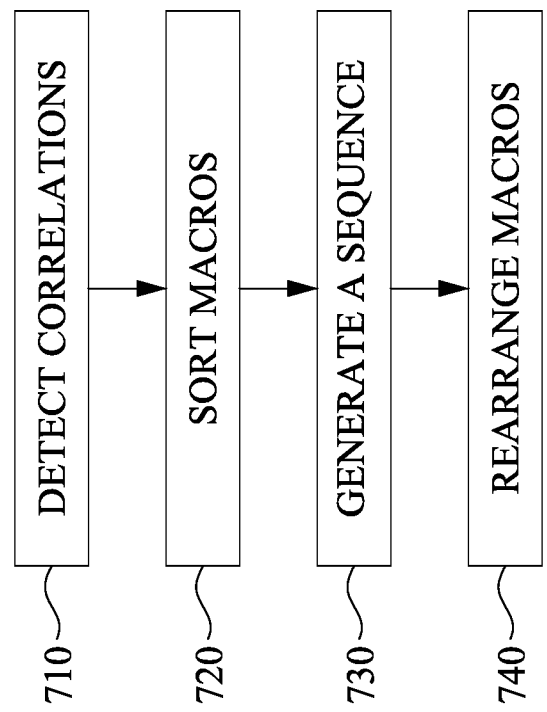
FIG. 7 is flow chart of an example in a dataflow macro adjustment stage of the method of FIG. 1, in accordance with some embodiments.

Reference is now made to FIG. 7. FIG. 7 is flow chart of an example in the dataflow macro adjustment stage 109 of the method 100 of FIG. 1, in accordance with some embodiments. For illustration, the method at the dataflow macro adjustment stage 109 includes operations 710-740. For ease of understanding, the operations 710-740 are discussed with reference to FIGS. 8A-8E. FIGS. 8A-8E are schematic diagrams of examples corresponding to the dataflow macro adjustment stage 109 of FIG. 7, in accordance with some embodiments. Like elements in FIGS. 8A-8E are designated with the same reference numbers for ease of understanding.

In operation 710, correlations between macros A-F and registers R1-R2 in FIG. 8A are detected. As shown in FIG. 8A, the register R1 is coupled to or has connection with the macros A-B and E-F, and the register R2 is coupled to or has connection with the macros C-D.

In some embodiments, the correlations between the macros A-F and the registers R1-R2 are shown, for example, in FIG. 8B. As illustratively shown in FIG. 8B, the macro A and other macros B, and E-F are coupled to the register R1. Accordingly, in a column corresponding to the macro A, values of 1 are in rows corresponding to the macros B, and E-F, and values of 0 are in rows corresponding to the macros C-D. In a column corresponding to the macro B, values of 1 are in the rows corresponding to the macros E-F, and values of 0 are in rows corresponding to the macros C-D. In a column corresponding to the macro E, a value of 1 is in a row corresponding to the macro F. The macros C-D are coupled to the register R2. Accordingly, in a column corresponding to the macro C, a value of 1 is in row corresponding to the macro D, and values of 0 are in rows corresponding to the macros E-F. In a column corresponding to the macro D, values of 0 are in rows corresponding to the macros E-F.

In operation 720, the macros A-F are sorted according to the detected correlations. As shown in FIG. 8C, the macros A-B and E-F are grouped, and the macros C-D are grouped.

In operation 730, sequences of the macros A-F in response to sorting are generated. For example, in some embodiments, the macros A-B and E-F are arranged in an order A-B-E-F. The macros C-D are arranged in an order C-D.

In operation 740, as shown in FIG. 8D, the macros A-F are re-arranged based on the sequences. In some embodiments, the re-arrangement starts from the sequences of the macros C-D, as shown in FIG. 8D. In various embodiments, the re re-arrangement starts from the sequences of the macros A-B and E-F. Alternatively stated, the macros are adjusted in accordance with the correlations between the macros A-F and the registers R1-R2.

In some embodiments, as shown in FIG. 8E, on the basis of the correlations between the macros A-F and the registers R1-R2, the macros A-B and E-F and the register R1 are placed in a region 810, and the macros C-D and the register R2 are placed in another region 820.

In some approaches, it is difficult to come out the best detailed macro grouping for reducing routing congestion. For example, a floor plan without passing the dataflow macro adjustment has a total of about 32249.5 hotspots. With the configurations of the present disclosure, the total of hotspots decreases about 25% (24305.17). In another example, a total of hotspots is about 35701.29 in some approaches. In contrast, the total of hotspots decreases about 33% (23753.37) by applying the dataflow macro adjustment. Accordingly, reduction to routing congestion is realized with the configurations of the present disclosure.

The configurations of FIGS. 7-8E are given for illustrative purposes. Various implements are within the contemplated scope of the present disclosure. For example, in some embodiments, the macros A-F are grouped without generating any sequence. Accordingly, the macros A-F are arranged based on grouping and the order are different from that in FIG. 8E. Specifically, the macros A-B are placed in top rows. In another embodiment, the macros A and E in FIG. 8E are switched. In yet another embodiment, the registers R1-R2 are placed on opposite sides of the macros A-F. In yet another embodiment, there are more than two registers and more than six macros are adjusted based on the operations shown in FIG. 7.

Figure 9A:
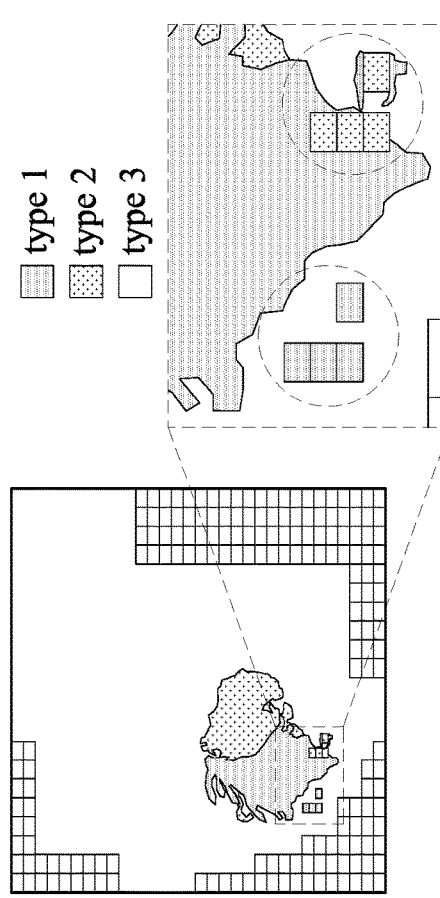
FIG. 9A is a schematic diagram of part of a floor plan of an integrated circuit, in accordance with some embodiments.

Reference is now made to FIG. 9A. FIG. 9A is a schematic diagram of part of a floor plan 900 of an integrated circuit, in accordance with some embodiments. In some embodiments, the floor plan 900 is generated at an isolated macro placement stage after the dataflow macro adjustment stage 109 of FIG. 1.

For illustration, as shown in FIG. 9A, the floor plan 900 includes macros of type 1, macros of type 2, and macros of type 3. In some embodiments, the macros of type 1 and type 2 are selected based on some criterions and then arranged isolated from other macros. For example, in some embodiments, the selected macros have macro-to-macro connection paths in their own hierarchy. A width and a height of each of the selected macros are smaller than about 30 micrometers. A number of the selected macro for grouping is less than or equal to 10. A centroid of the selected macros is placed a distance away from a closest boundary in the floor plan 900. For example, as shown in FIG. 9A, in some embodiment, a centroid of the macros of type 1 are away from the boundary of the macros of type 3 more than about 50 micrometers.

In some embodiments, each macro (rectangle block) of type 1 is at a spacing from macros of type 2, macros of type 3, and/or other elements. In some embodiments, the spacing is about 2 micrometers. The spacing is given for illustrative purposes. Other values are within the scope of the present disclosure. Alternatively stated, no other macro is placed within a range of about 2 micrometers with respect to each macro of type 1.

In some approaches, macros are influenced by nearby macros and/or routing components, and accordingly the speed is not optimized. With the configurations of FIG. 9A, a post-route speed of the isolated macros is improved by 132 MHz, compared with some approaches.

Figure 9B:
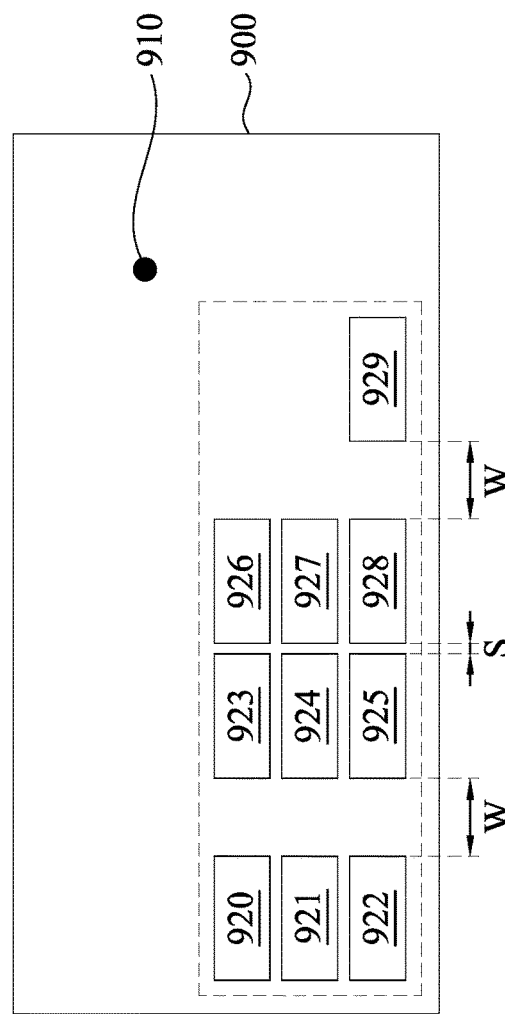
FIG. 9B is a schematic diagram of part of a floor plan of the integrated circuit, in accordance with some embodiments.

Reference is now made to FIG. 9B. FIG. 9B is a schematic diagram of part of the floor plan 900 of the integrated circuit, in accordance with some embodiments. For illustration, the floor plan 900 further includes macros 920-929 circled with dash line. The macros 920-922 are a distance W away from the macros 923-925. The macros 926-928 are the distance W away from the macro 929. The macros 923-925 are a spacing S away from the macros 926-928. In some embodiments, the distance W is referred to as a width of channels interposed between the macros, and a minimum of the spacing S is determined by technology nodes (i.e., manufacturing limitations or design rules).

In some embodiments, the macros 920-929 are L-shape stacked or placed. For illustration, instead of placing the macros 926-928 below the macros 920-922 and placing the macro 929 below the macros 923-925, the macros 923 and 926 are placed in the same row, the macros 924 and 927 are placed in the same row, and the macros 925 and 928-929 are placed in the same row. Alternatively stated, the macros 926-929 are arranged closer to a centroid 910. In some embodiments, the centroid 910 is configured with respect to the centroid 230 of FIG. 2.

In some approaches, macros are for example, rectangle stacked, rather than L-shape placed. Consequently, some macros are far away from a coupled register at the centroid. With the configurations of FIG. 9B, smaller degree of distance difference between macros and registers is achieved, compared with some approaches.

The configurations of FIGS. 9A-9B are given for illustrative purposes. Various implements are within the contemplated scope of the present disclosure. For example, in some embodiments, at the isolated macro placement stage, the selected macros of a type are also placed away from unselected macros of the same type.

In some embodiments, with the configurations of FIGS. 1-9B, the design implementation turnaround time is improved by about 170 times. A number of rule violations of floor plans is reduced by about 52%. Routing difficulty is dealt with by reducing total overflow values by 52% with the channel resource adjustment of the present disclosure.

Figure 10:
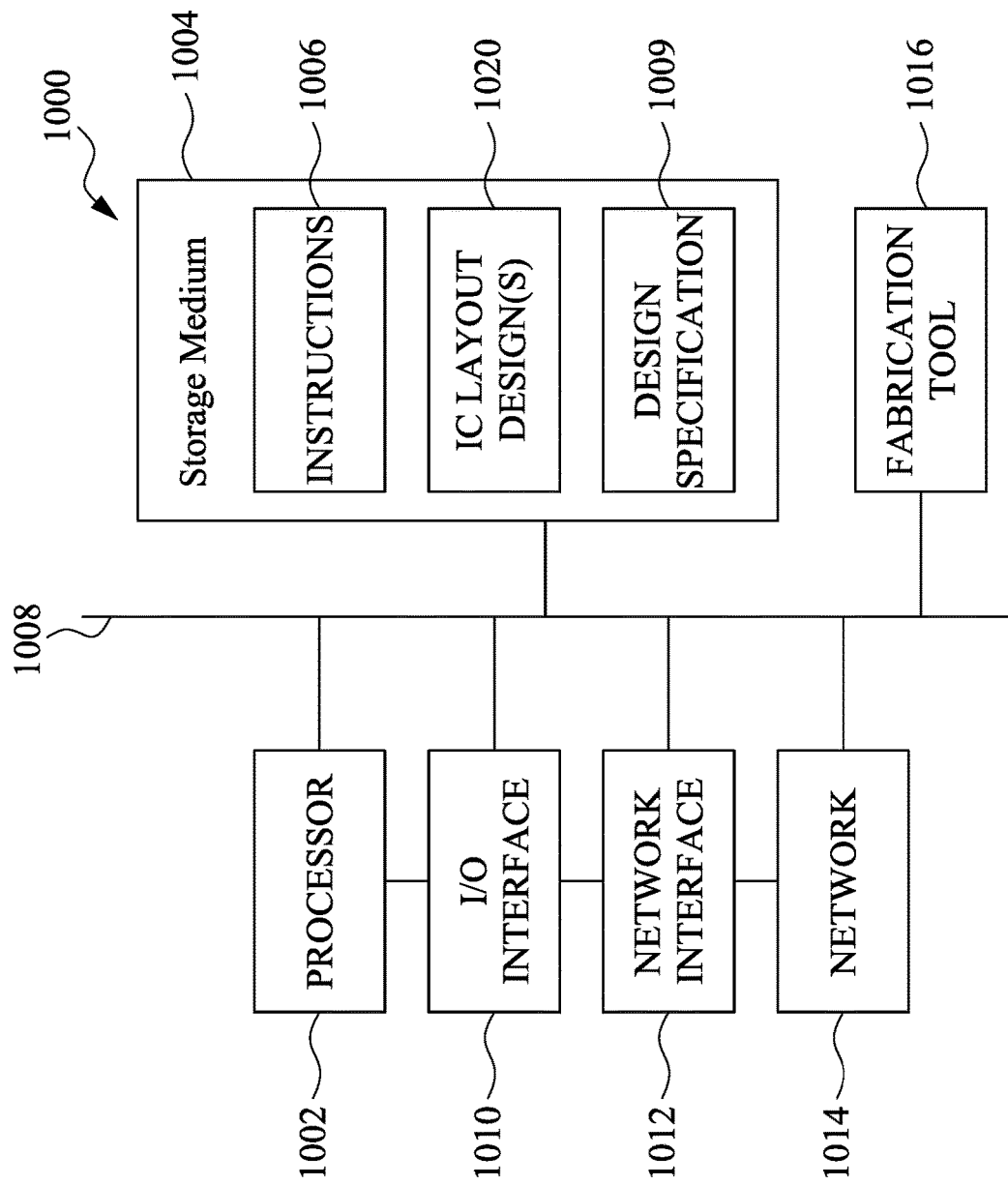
FIG. 10 is a block diagram of a system for designing the integrated circuit layout design, in accordance with some embodiments of the present disclosure.

Reference is now made to FIG. 10. FIG. 10 is a block diagram of electronic design automation (EDA) system 1000 for designing the integrated circuit layout design, in accordance with some embodiments of the present disclosure. EDA system 1000 is configured to implement one or more operations of the method 100 disclosed in FIG. 1, and further explained in conjunction with FIGS. 2-9B. In some embodiments, EDA system 1000 includes an APR system.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code (instructions) 1006, i.e., a set of executable instructions. Execution of instructions 1006 by hardware processor 1002 represents (at least in part) an EDA tool which implements a portion or all of, e.g., the method 100.

The processor 1002 is electrically coupled to computer-readable storage medium 1004 via a bus 1008. The processor 1002 is also electrically coupled to an I/O interface 1010 and a fabrication tool 1016 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. The processor 1002 is configured to execute computer program code 1006 encoded in computer-readable storage medium 1004 in order to cause EDA system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause EDA system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores IC layout diagram 1020 of standard cells including such standard cells as disclosed herein, for example, a cell including in the floor plans 200, 310, 400, 600, 900, and the regions 810-820 discussed above with respect to FIGS. 2-9B.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows EDA system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1064. In one or more embodiments, a portion or all of noted processes and/or methods are implemented in two or more systems 1000.

EDA system 1000 also includes the fabrication tool 1016 coupled to processor 1002. The fabrication tool 1016 is configured to fabricate integrated circuits, according to the design files, e.g., the floor plans 200, 310, 400, 600, 900, and the regions 810-820 discussed above with respect to FIGS. 2-9B, processed by the processor 1002.

EDA system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as design specification 1022.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 1000. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 11:
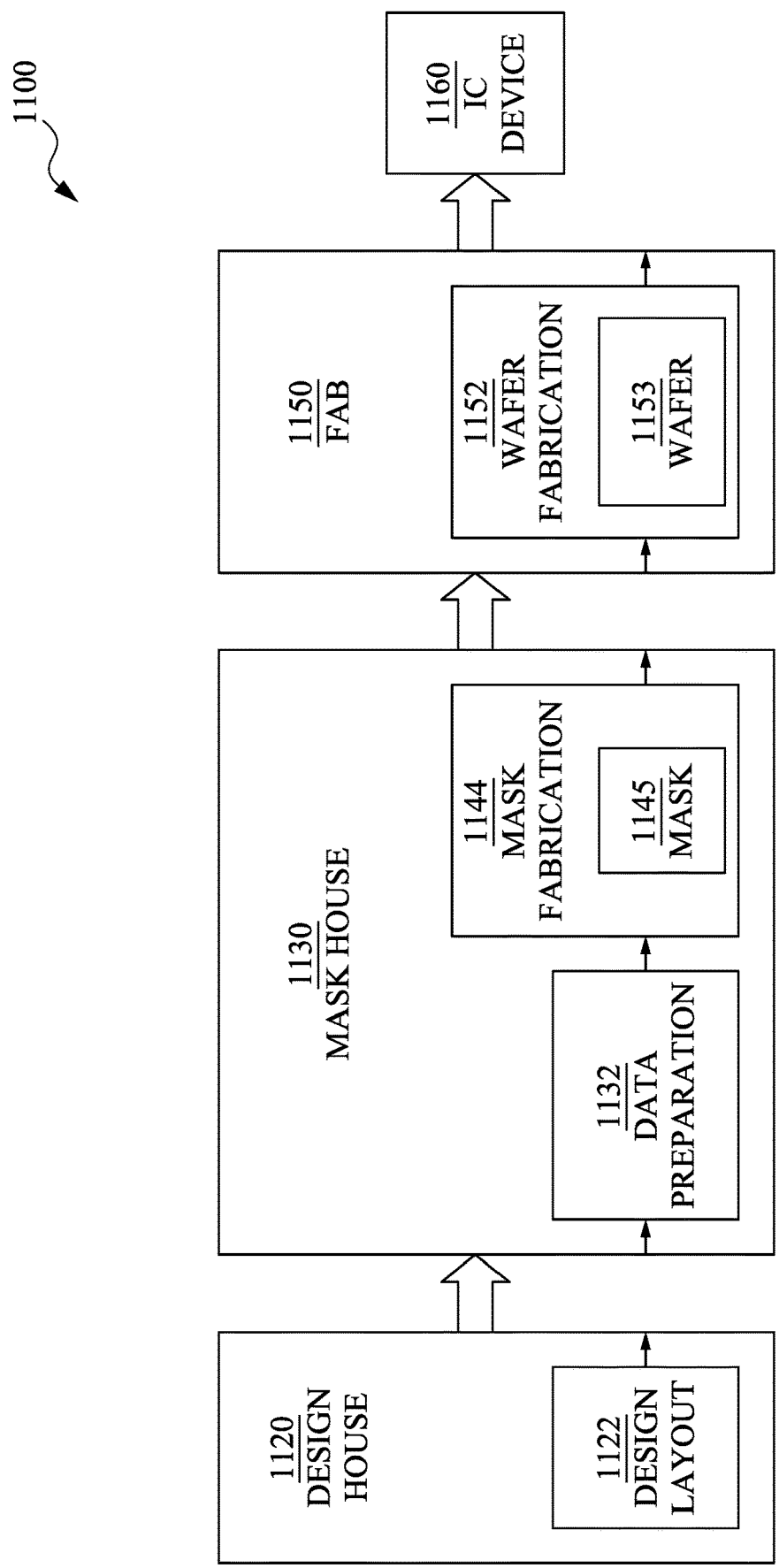
FIG. 11 is a block diagram of an integrated circuit manufacturing system, and an integrated circuit manufacturing flow associated therewith, in accordance with some embodiments.

FIG. 11 is a block diagram of IC manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in IC manufacturing system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single entity. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, for example, an IC layout design for an IC device 1160, for example, the floor plans 200, 310, 400, 600, 900, and the regions 810-820 discussed above with respect to FIGS. 2-9B. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The IC design layout diagram 1122 is manipulated by mask data preparation 1132 to comply with particular characteristics of the mask writer and/or requirements of IC fab 1150. In FIG. 11, data preparation 1132 and mask fabrication 1144 are illustrated as separate elements. In some embodiments, data preparation 1132 and mask fabrication 1144 can be collectively referred to as mask data preparation.

In some embodiments, data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1145 includes a transparent substrate (for example, fused quartz) and an opaque material (for example, chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or adjusting PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes wafer fabrication 1152. IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

As described above, a method is provided in the present disclosure for generating floor plans. By utilizing the method, macros in the floor plans are adjusted and placed automatically in an optimized way and accordingly better routing arrangement and faster timing paths are achieved.

In some embodiments, a method is provided. The method includes operations as below: forming a first group of macros in a first region, wherein the first group of macros are aligned with a first boundary of a channel that is coupled thereto through pins of the first group of macros; forming a second group of macros in the first region to align with a second boundary of the channel that is coupled thereto through pins of the second group of macros, wherein the first and second groups of macros are coupled to a first register; and forming a third group of macros in a second region different from the first region. A first macro and a second macro that are in the third group of macros are aligned with the first and second boundaries respectively. The third group of macros are coupled to a second register different from the first register. In some embodiments, forming the first group of macros includes adjusting the first group of macros according to a channel area of the channel interposed between the pins of the first group of macros. In some embodiments, forming the second group of macros includes adjusting the second group of macros according to the channel area. In some embodiments, adjusting the first group of macros and the second group of macros includes generating a chain map of the first group of macros and the second group of macros; and in response to searching the chain map, flipping corresponding macros in the first group of macros and the second group of macros to change orientations of pins of the corresponding macros. In some embodiments, the method further includes partitioning a plurality of standard cells; estimating a number of a plurality of buffers according to a predicted channel path for each of the first group of macros, wherein the predicted channel path is between one of the plurality of standard cells and a corresponding one of the first group of macros; and on the basis of the number of the plurality of buffers and an area of each of the plurality of buffers, calculating a predicted channel width for the corresponding one of the first group of macros. In some embodiments, forming the first group of macros includes separating the first group of macros by a channel width determined according to the predicted channel widths of the first group of macros. In some embodiments, the channel width is a maximum of the predicted channel widths. In some embodiments, forming the first group of macros includes on the basis of a comparison of a plurality of weights of the first group of macros, placing the first group of macros in the first region. A weight of one of the first group of macros corresponds to a connection relationship of the one of the first group of macros. In some embodiments, the connection relationship of the one of the first group of macros is associated with a number of a plurality of fan-in points, a number of a plurality of fan-out points, and a number of stages between the one of the first group of macros and the first register. In some embodiments, forming the second group of macros includes on the basis of a comparison of a plurality of weights of the second group of macros, placing the second group of macros in the second region. A weight of one of the second group of macros corresponds to a connection relationship of the one of the second group of macros. The connection relationship of the one of the second group of macros is associated with a number of a plurality of fan-in points, a number of a plurality of fan-out points, and a number of stages between the one of the second group of macros and the second register.

Also disclosed is a system, including one or more processing units; and a memory unit configured to store instructions that when executed by at least one of the one or more processing units perform operations, including calculate a channel width of each of a plurality of channels interposed between a plurality of macros based on area of buffers inserted in the plurality of channels; and separate the plurality of macros based on a largest width of the channel widths of the plurality of channels to form an interposed channel. The plurality of macros are aligned with boundaries of the interposed channel. In some embodiments, the operations further comprise place the plurality of macros around a centroid of a region in a floor plan according to a plurality of weights of the plurality of macros. In some embodiments, the operations further comprise detect correlations between the plurality of macros and a plurality of registers; sort the plurality of macros according to the correlations; and generate a sequence of the plurality of macros in response to sorting. In some embodiments, the operations further comprise adjust the plurality of macros according to the sequence. In some embodiments, the operations further comprise place a first group in the plurality of macros in a first region and a second group in the plurality of macros according to the sequence. In some embodiments, the operations further comprise define a plurality of group boxes for the plurality of macros; and align the plurality of macros with a plurality of boundaries of the plurality of group boxes.

Also disclosed is an integrated circuit, including a plurality of macros, wherein a first portion of the plurality of macros is closer to a plurality of boundaries of a floor plan in accordance with a plurality of weights of the plurality of macros, compared with a second portion of the plurality of macros. The plurality of macros further comprise a plurality of pins facing to each other and aligned with a plurality of channels that are interposed between the plurality of pins and extend in a first direction. The plurality of pins are separated from each other in a second direction different from the first direction. In some embodiments, each macro of the first portion of the plurality of macros is at a spacing from a second portion of the plurality of macros. The spacing is greater than about 2 micrometers. In some embodiments, the first portion of the plurality of macros have smaller weights than that of the second portion of the plurality of macros. The weight of a corresponding macro of the plurality of macros is associated with a number of a plurality of fan-in points, a number of a plurality of fan-out points, and a number of stages between the corresponding macro and a plurality of registers coupled thereto. In some embodiments, when a number of the plurality of macros is an odd number and a first macro of the plurality of macros is adjacent a first boundary of the floor plan, an orientation of a pin of the first macro is arranged opposite of the first boundary of the floor plan.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and adjustations herein without departing from the spirit and scope of the present disclosure.

What is claimed is:
1. A method, comprising:
  forming a first group of macros in a first region, wherein the first group of macros are aligned with a first boundary of a channel that is coupled thereto through pins of the first group of macros;

forming a number of a plurality of buffers in the channel, wherein the number of the plurality of buffers is associated with a predicted channel path for each one in the first group of macros, wherein the predicted channel path is between one of a plurality of standard cells and a corresponding one of the first group of macros;

forming a second group of macros in the first region to align with a second boundary of the channel that is coupled thereto through pins of the second group of macros, wherein the first and second groups of macros are coupled to a first register; and forming a third group of macros in a second region different from the first region, wherein a first macro and a second macro that are in the third group of macros are aligned with the first and second boundaries of the channel respectively, wherein the third group of macros are coupled to a second register different from the first register.

2. The method of claim 1, wherein forming the first group of macros includes:
adjusting the first group of macros according to a channel area of the channel interposed between the pins of the first group of macros.

3. The method of claim 2, wherein forming the second group of macros includes:
adjusting the second group of macros according to the channel area.

4. The method of claim 3, wherein adjusting the first group of macros and the second group of macros includes:
generating a chain map of the first group of macros and the second group of macros; and
in response to searching the chain map, flipping corresponding macros in the first group of macros and the second group of macros to change orientations of pins of the corresponding macros.

5. The method of claim 1, further comprising:
on the basis of the number of the plurality of buffers and an area of each of the plurality of buffers, calculating a predicted channel width for the corresponding one of the first group of macros.

6. The method of claim 5, wherein forming the first group of macros includes:
separating the first group of macros by a channel width determined according to the predicted channel widths of the first group of macros.

7. The method of claim 6, wherein the channel width is a maximum of the predicted channel widths.

8. The method of claim 1, wherein forming the first group of macros includes:
on the basis of a comparison of a plurality of weights of the first group of macros, placing the first group of macros in the first region, wherein a weight of one of the first group of macros corresponds to a connection relationship of the one of the first group of macros.

9. The method of claim 8, wherein the connection relationship of the one of the first group of macros is associated with a number of a plurality of fan-in points, a number of a plurality of fan-out points, and a number of stages between the one of the first group of macros and the first register.

10. The method of claim 9, wherein forming the second group of macros includes:
on the basis of a comparison of a plurality of weights of the second group of macros, placing the second group of macros in the second region, wherein a weight of one of the second group of macros corresponds to a connection relationship of the one of the second group of macros,
wherein the connection relationship of the one of the second group of macros is associated with a number of a plurality of fan-in points, a number of a plurality of fan-out points, and a number of stages between the one of the second group of macros and the second register.

11. A method, comprising:
calculating a channel width of each of a plurality of channels interposed between a plurality of macros based on area of buffers inserted in the plurality of channels;
separating the plurality of macros based on a largest width of the channel widths of the plurality of channels to form an interposed channel; and
forming the plurality of macros aligned with first and second boundaries of the interposed channel and are coupled thereto through pins of the plurality of macros.

12. The method of claim 11, further comprising:
placing the plurality of macros around a centroid of a region in a floor plan according to a plurality of weights of the plurality of macros.

13. The method of claim 11, further comprising:
detecting correlations between the plurality of macros and a plurality of registers;
sorting the plurality of macros according to the correlations; and
generating a sequence of the plurality of macros in response to sorting.

14. The method of claim 13, further comprising:
adjusting the plurality of macros according to the sequence.

15. The method of claim 13, further comprising:
placing a first group in the plurality of macros in a first region and a second group in the plurality of macros according to the sequence.

16. The method of claim 11, further comprising:
defining a plurality of group boxes for the plurality of macros; and
aligning the plurality of macros with a plurality of boundaries of the plurality of group boxes.

17. A method, comprising:
forming a first group of macros in a first region, wherein the first group of macros are aligned with a first boundary of a channel that is coupled thereto through pins of the first group of macros; and
forming a second group of macros in the first region to align with a second boundary of the channel that is coupled thereto through pins of the second group of macros, wherein the first and second groups of macros are coupled to a register,
wherein the first group of macros and the second group of macros in a floor plan are formed according to a plurality of weights of the first group of macros and the second group of macros.

18. The method of claim 17, further comprising:
when a number of the first group of macros is an odd number and a first macro of the first group of macros is adjacent a first boundary of the floor plan, arranging an orientation of a pin of the first macro opposite of the first boundary of the floor plan.

19. The method of claim 17, wherein a first portion of the first group of macros and the second group of macros are closer to a plurality of boundaries of the floor plan, compared with a second portion of the first group of macros and the second group of macros, wherein the first portion of the first group of macros and the second group of macros have smaller weights than that of the second portion of the first group of macros and the second group of macros.

20. The method of claim 17, wherein one of the plurality of weights is associated with a number of a plurality of fan-in points, a number of a plurality of fan-out points, and a number of stages between the register and a corresponding macro of the first and second groups of macros.

* * * * *